(12) United States Patent
Harada

(10) Patent No.: US 10,715,186 B2
(45) Date of Patent: Jul. 14, 2020

(54) HIGH FREQUENCY MODULE AND COMMUNICATION DEVICE

(71) Applicant: Murata Manufacturing Co., Ltd., Kyoto (JP)

(72) Inventor: Tetsuro Harada, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/364,527

(22) Filed: Mar. 26, 2019

(65) Prior Publication Data

US 2019/0222237 A1    Jul. 18, 2019

Related U.S. Application Data

(63) Continuation of application No. PCT/JP2017/033994, filed on Sep. 20, 2017.

(30) Foreign Application Priority Data

Sep. 30, 2016  (JP) ................. 2016-194977

(51) Int. Cl.
   *H04B 1/00*   (2006.01)
   *H03F 1/02*   (2006.01)
   (Continued)

(52) U.S. Cl.
   CPC ............ *H04B 1/0057* (2013.01); *H03F 1/02* (2013.01); *H03F 3/24* (2013.01); *H03F 3/72* (2013.01);
   (Continued)

(58) Field of Classification Search
   CPC ............................ H04B 1/0057; H03F 1/02
   See application file for complete search history.

(56) References Cited

U.S. PATENT DOCUMENTS

2006/0276158 A1    12/2006  Okabe
2011/0110452 A1*   5/2011   Fukamachi ......... H01P 1/20336
                                                   375/267
(Continued)

FOREIGN PATENT DOCUMENTS

JP    2001-267952 A    9/2001
JP    2006-340257 A    12/2006
(Continued)

OTHER PUBLICATIONS

International Search Report for International Application No. PCT/JP2017/033994, dated Dec. 5, 2017.

(Continued)

*Primary Examiner* — Tuan H Nguyen
(74) *Attorney, Agent, or Firm* — Pearne & Gordon LLP

(57) ABSTRACT

In a high frequency module, a first band processing circuit, a second band processing circuit, and a third band processing circuit. The first band processing circuit is used at the same time as the third band processing circuit (D3) when wireless communication is performed. A frequency of a harmonic of a first transmission signal of the first band processing circuit is included in a frequency band of a third reception signal of the third band processing circuit. The second band processing circuit is not used at the same time as the first band processing circuit and the third band processing circuit (D3) when wireless communication is performed and is disposed between the first band processing circuit and the third band processing circuit in a plan view of the substrate.

20 Claims, 7 Drawing Sheets

(51) Int. Cl.
*H04B 1/50* (2006.01)
*H04B 1/04* (2006.01)
*H04B 1/525* (2015.01)
*H03F 3/24* (2006.01)
*H03F 3/72* (2006.01)

(52) U.S. Cl.
CPC ............. *H04B 1/00* (2013.01); *H04B 1/0064* (2013.01); *H04B 1/04* (2013.01); *H04B 1/50* (2013.01); *H04B 1/525* (2013.01); *H03F 2203/7209* (2013.01)

(56) References Cited

U.S. PATENT DOCUMENTS

| | | | |
|---|---|---|---|
| 2014/0051371 A1* | 2/2014 | Saji | H04B 1/525 455/78 |
| 2017/0149469 A1 | 5/2017 | Kitajima | |
| 2017/0264337 A1 | 9/2017 | Kogure et al. | |

FOREIGN PATENT DOCUMENTS

| | | |
|---|---|---|
| JP | 2012-070141 A | 4/2012 |
| WO | 2016/010063 A1 | 1/2016 |
| WO | 2016/104011 A1 | 6/2016 |

OTHER PUBLICATIONS

Written Opinion for International Application No. PCT/JP2017/033994, dated Dec. 5, 2017.

* cited by examiner

FIG. 2

| BAND PROCESSING CIRCUIT | USAGE BAND | PASS BAND OF TRANSMISSION FILTER (MHz) | PASS BAND OF RECEPTION FILTER (MHz) |
|---|---|---|---|
| FIRST BAND PROCESSING CIRCUIT D1 | Band17 | 704~716 | 734~746 |
| SECOND BAND PROCESSING CIRCUIT D2 | Band26 | 814~849 | 859~894 |
| THIRD BAND PROCESSING CIRCUIT D3 | Band4 | 1710~1755 | 2110~2155 |
| FOURTH BAND PROCESSING CIRCUIT D4 | Band25 | 1850~1915 | 1930~1995 | ular to a surface of the substrate where the first band processing circuit, the second band processing circuit and the third band processing circuit are disposed) of the substrate.
HIGH FREQUENCY MODULE AND COMMUNICATION DEVICE This is a continuation of International Application No. PCT/JP2017/033994 filed on Sep. 20, 2017 which claims priority from Japanese Patent Application No. 2016-194977 filed on Sep. 30, 2016. The contents of these applications are incorporated herein by reference in their entireties.

BACKGROUND

Technical Field

The present disclosure relates to a high frequency module and a communication device for wirelessly transmitting and receiving signals of different bands.

Recently, as a communication method for wirelessly transmitting and receiving signals of different bands, a communication method using carrier aggregation, for example, has been known.

As an example of a high frequency module configured to perform communication by carrier aggregation, Patent Document 1 discloses a high frequency module in which a low band transmission and reception unit for transmitting and receiving a signal of a low frequency band and a high band transmission and reception unit for transmitting and receiving a signal of a frequency band higher than the low frequency band are disposed on a substrate.

The low band transmission and reception unit includes a first amplification circuit and a first demultiplexing circuit, and the high band transmission and reception unit includes a second amplification circuit and a second demultiplexing circuit. The first demultiplexing circuit filters a low band transmission signal inputted from the first amplification circuit side and outputs the filtered signal to an antenna terminal and filters a low band reception signal inputted from the antenna terminal side and outputs the filtered signal to a reception circuit. The second demultiplexing circuit filters a high band transmission signal inputted from the second amplification circuit side and outputs the filtered signal to an antenna terminal and filters a high band reception signal inputted from the antenna terminal side and outputs the filtered signal to a reception circuit.

In the high frequency module disclosed in Patent Document 1, by disposing the first demultiplexing circuit between the first amplification circuit and the second demultiplexing circuit on the substrate, a situation in which harmonics of the low band transmission signal outputted from the first amplification circuit side are inputted to the second demultiplexing circuit configured to handle the high band is suppressed. With this, isolation between the first amplification circuit and the second demultiplexing circuit is secured when signals of different bands are wirelessly transmitted and received.

Patent Document 1: International Publication No. WO 2016/104011

BRIEF SUMMARY

However, in the high frequency module disclosed in Patent Document 1, harmonics of the low band transmission signal are still inputted to the second demultiplexing circuit configured to handle the high band in some cases.

The present disclosure provides a high frequency module and the like in which signal interference between bands is suppressed when signals of different bands are wirelessly transmitted and received.

A high frequency module according to an aspect of the present disclosure is a high frequency module for wireless communication that includes, on a substrate, a first band processing circuit having a first transmission filter configured to filter a signal of a first frequency band and output the filtered signal as a first transmission signal; a second band processing circuit having a second transmission filter configured to filter a signal of a second frequency band, which is a signal of a different frequency band from the first frequency band, and output the filtered signal as a second transmission signal, or a second reception filter configured to filter a signal of the second frequency band and output the filtered signal as a second reception signal; and a third band processing circuit having a third reception filter configured to filter a signal of a third frequency band, which is a signal of a different frequency band from the first frequency band and the second frequency band, and output the filtered signal as a third reception signal. In the high frequency module, the first band processing circuit is used at the same time as the third band processing circuit when the wireless communication is performed; a harmonic frequency of the first transmission signal is included in a frequency band of the third reception signal; and the second band processing circuit is not used at the same time as the first band processing circuit and the third band processing circuit when the wireless communication is performed, and is disposed between the first band processing circuit and the third band processing circuit in a plan view (when viewed in a direction perpendicular to a surface of the substrate where the first band processing circuit, the second band processing circuit and the third band processing circuit are disposed) of the substrate.

A high frequency module according to an aspect of the present disclosure is a high frequency module for wireless communication that includes, on a substrate, a first band processing circuit having a first transmission filter configured to filter a signal of a first frequency band and output the filtered signal as a first transmission signal; a second band processing circuit having a second transmission filter configured to filter a signal of a second frequency band, which is a signal of a different frequency band from the first frequency band, and output the filtered signal as a second transmission signal, or a second reception filter configured to filter a signal of the second frequency band and output the filtered signal as a second reception signal; and a third band processing circuit having a third reception filter configured to filter a signal of a third frequency band, which is a signal of a different frequency band from the first frequency band and the second frequency band, and output the filtered signal as a third reception signal. In the high frequency module, a harmonic frequency of the first transmission signal is included in a frequency band of the third reception signal; and the second band processing circuit is disposed between the first band processing circuit and the third band processing circuit in a plan view (when viewed in a direction perpendicular to a surface of the substrate where the first band processing circuit, the second band processing circuit and the third band processing circuit are disposed) of the substrate.

As described above, by disposing the second band processing circuit, which is not used at the same time as the first band processing circuit and the third band processing circuit when wireless communication is performed, between the first band processing circuit and the third band processing circuit, it is possible to increase a distance between the first band processing circuit and the third band processing circuit and to suppress the electromagnetic field coupling and the electrostatic coupling between the first band processing circuit and the third band processing circuit. This makes it possible, even in a case where the frequency of a harmonic of the first transmission signal outputted from the first transmission filter includes a pass band of the third reception filter, to suppress a situation in which the harmonic is superimposed on the third reception signal passing through the third reception filter. Therefore, it is possible to suppress signal interference between the first band processing circuit and the third band processing circuit.

Further, the first band processing circuit may include a first reception filter configured to filter a signal of the first frequency band and output the filtered signal as a first reception signal, and the third band processing circuit may include a third transmission filter configured to filter a signal of the third frequency band and output the filtered signal as a third transmission signal.

As described above, by the first reception filter outputting the first reception signal and by the third transmission filter outputting the third transmission signal, it is possible to provide a high frequency module configured to wirelessly transmit and receive signals of a larger number of different bands.

In addition, the first band processing circuit may include a first duplexer constituted of the first transmission filter and the first reception filter, the second band processing circuit may include a second duplexer constituted of the second transmission filter and the second reception filter, and the third band processing circuit may include a third duplexer constituted of the third transmission filter and the third reception filter.

As described above, since the first band processing circuit, the second band processing circuit and the third band processing circuit are constituted of different duplexers, it is possible to provide a high frequency module configured to wirelessly transmit and receive signals of a larger number of different bands.

Further, there may be provided, on the substrate, a fourth band processing circuit having a fourth transmission filter configured to filter a signal of a fourth frequency band, which is a signal of a different frequency band from the first, second and third frequency bands, and output the filtered signal as a fourth transmission signal, or a fourth reception filter configured to filter a signal of the fourth frequency band and output the filtered signal as a fourth reception signal. The fourth band processing circuit is not to be used at the same time as the first band processing circuit and the third band processing circuit when the wireless communication is performed and may be disposed between the first band processing circuit and the third band processing circuit in a plan view of the substrate.

As described above, by disposing the fourth band processing circuit, which is not used at the same time as the first band processing circuit and the third band processing circuit when wireless communication is performed, between the first band processing circuit and the third band processing circuit, it is possible to increase a distance between the first band processing circuit and the third band processing circuit and to suppress the electromagnetic field coupling and the electrostatic coupling between the first band processing circuit and the third band processing circuit. This makes it possible, even in a case where the frequency of a harmonic of the first transmission signal outputted from the first transmission filter includes a pass band of the third reception filter, to suppress a situation in which the harmonic is superimposed on the third reception signal passing through the third reception filter. Therefore, it is possible to suppress signal interference between the first band processing circuit and the third band processing circuit.

Further, there may be provided, on the substrate, a fourth band processing circuit having a fourth transmission filter configured to filter a signal of a fourth frequency band, which is a signal of a different frequency band from the first, second and third frequency bands, and output the filtered signal as a fourth transmission signal, or a fourth reception filter configured to filter a signal of the fourth frequency band and output the filtered signal as a fourth reception signal. The frequencies of a fundamental wave and a harmonic of the fourth transmission signal may not be included in the frequency bands of the first, second and third reception signals, the frequencies of a fundamental wave and a harmonic of each of the first, second and third transmission signals may not be included in the frequency band of the fourth reception signal, and the fourth band processing circuit may be disposed between the first band processing circuit and the third band processing circuit in a plan view of the substrate.

As described above, since the fourth band processing circuit, where the frequencies of the fundamental wave and the harmonic of the outputted fourth transmission signal are not included in the frequency band of the third reception signal, is disposed between the first band processing circuit and the third band processing circuit, it is possible to increase the distance between the first band processing circuit and the third band processing circuit and to suppress the electromagnetic field coupling and the electrostatic coupling between the first band processing circuit and the third band processing circuit. This makes it possible, even in a case where the frequency of a harmonic of the first transmission signal outputted from the first transmission filter includes a pass band of the third reception filter, to suppress a situation in which the harmonic is superimposed on the third reception signal passing through the third reception filter. Therefore, it is possible to suppress signal interference between the first band processing circuit and the third band processing circuit.

In addition, there may be provided, on the substrate, a first amplification circuit configured to output a signal of the first frequency band to the first band processing circuit and output a signal of the second frequency band to the second band processing circuit, and a second amplification circuit configured to output a signal of the third frequency band to the third band processing circuit and output a signal of the fourth frequency band to the fourth band processing circuit. Further, the above substrate may be constituted of a first substrate and a second substrate located adjacent to the first substrate, the first band processing circuit, the second band processing circuit and the first amplification circuit may be formed on the first substrate, and the third band processing circuit, the fourth band processing circuit and the second amplification circuit may be formed on the second substrate.

With this configuration, the distance between the first band processing circuit formed on the first substrate and the third band processing circuit formed on the second substrate can be increased to a distance at which the electromagnetic field coupling and electrostatic coupling hardly occur, and the signal interference between the first band processing circuit and the third band processing circuit can be suppressed. Further, since a predetermined number of band processing circuits and amplification circuits can be formed on each substrate and unitized as a unit, it is possible to improve the efficiency of circuit design.

The first amplification circuit may generate a harmonic included in the frequency band of the third reception signal and may be disposed at a position more distant than a position of the second band processing circuit relative to a position of the third band processing circuit as a reference.

According to this configuration, it is possible to suppress a situation in which the harmonic of the transmission signal generated from the first amplification circuit is superimposed on the third reception signal passing through the third reception filter, and to suppress signal interference between the first amplification circuit and the third band processing circuit.

The harmonic of the first transmission signal may be a third order harmonic.

According to this configuration, it is possible to suppress the signal interference between the first band processing circuit and the third band processing circuit even if the harmonic of the first transmission signal is a third order harmonic.

A high frequency module according to an aspect of the present disclosure is a high frequency module for wireless communication that includes, on a substrate, a first band processing circuit having a first transmission filter configured to filter a signal of a first frequency band and output the filtered signal as a first transmission signal; a second band processing circuit having a second transmission filter configured to filter a signal of a second frequency band, which is a signal of a different frequency band from the first frequency band, and output the filtered signal as a second transmission signal, or a second reception filter configured to filter a signal of the second frequency band and output the filtered signal as a second reception signal; and a third band processing circuit having a third reception filter configured to filter a signal of a third frequency band, which is a signal of a different frequency band from the first frequency band and the second frequency band, and output the filtered signal as a third reception signal. In the high frequency module, the first band processing circuit is used at the same time as the third band processing circuit when the wireless communication is performed; a harmonic frequency of the first transmission signal is included in a frequency band of the third reception signal; the frequencies of a fundamental wave and a harmonic of the second transmission signal are not included in the frequency band of the third reception signal; and the second band processing circuit is disposed between the first band processing circuit and the third band processing circuit in a plan view of the substrate.

As described above, since the second band processing circuit, where the frequencies of the fundamental wave and the harmonic of the outputted second transmission signal are not included in the frequency band of the third reception signal, is disposed between the first band processing circuit and the third band processing circuit, it is possible to increase the distance between the first band processing circuit and the third band processing circuit and to suppress the electromagnetic field coupling and the electrostatic coupling between the first band processing circuit and the third band processing circuit. This makes it possible, even in a case where the frequency of a harmonic of the first transmission signal outputted from the first transmission filter includes a pass band of the third reception filter, to suppress a situation in which the harmonic is superimposed on the third reception signal passing through the third reception filter. Therefore, it is possible to suppress signal interference between the first band processing circuit and the third band processing circuit.

Further, the first band processing circuit may include a first reception filter configured to filter a signal of the first frequency band and output the filtered signal as a first reception signal, and the third band processing circuit may include a third transmission filter configured to filter a signal of the third frequency band and output the filtered signal as a third transmission signal.

As described above, by the first reception filter outputting the first reception signal and by the third transmission filter outputting the third transmission signal, it is possible to provide a high frequency module configured to wirelessly transmit and receive signals of a larger number of different bands.

In addition, the first band processing circuit may further include a first duplexer constituted of the first transmission filter and the first reception filter, the second band processing circuit may include a second duplexer constituted of the second transmission filter and the second reception filter, and the third band processing circuit may include a third duplexer constituted of the third transmission filter and the third reception filter.

As described above, since the first band processing circuit, the second band processing circuit and the third band processing circuit are constituted of different duplexers, it is possible to provide a high frequency module configured to wirelessly transmit and receive signals of a larger number of different bands.

When the wireless communication is performed, in a case where the second band processing circuit is used at the same time as the first band processing circuit, the frequencies of the fundamental wave and the harmonic of the second transmission signal can be not included in the frequency band of the first reception signal, and the frequencies of the fundamental wave and the harmonic of the first transmission signal can be not included in the frequency band of the second reception signal, and in a case where the second band processing circuit is used at the same time as the third band processing circuit, the frequencies of the fundamental wave and the harmonic of the third transmission signal can be not included in the frequency band of the second reception signal.

With this configuration, it is possible to suppress signal interference between the first band processing circuit and the third band processing circuit even when the second band processing circuit is used at the same time as the first band processing circuit and the third band processing circuit.

Further, there may be provided, on the substrate, a fourth band processing circuit having a fourth transmission filter configured to filter a signal of a fourth frequency band, which is a signal of a different frequency band from the first, second and third frequency bands, and output the filtered signal as a fourth transmission signal, or a fourth reception filter configured to filter a signal of the fourth frequency band and output the filtered signal as a fourth reception signal. The frequencies of a fundamental wave and a harmonic of the fourth transmission signal may not be included in the frequency bands of the first, second and third reception signals, the frequencies of a fundamental wave and a harmonic of each of the first, second and third transmission signals may not be included in the frequency band of the fourth reception signal, and the fourth band processing circuit may be disposed between the first band processing circuit and the third band processing circuit in a plan view of the substrate.

As described above, since the fourth band processing circuit, where the frequencies of the fundamental wave and the harmonic of the outputted fourth transmission signal are not included in the frequency band of the third reception signal, is disposed between the first band processing circuit and the third band processing circuit, it is possible to increase the distance between the first band processing circuit and the third band processing circuit and to suppress the electromagnetic field coupling and the electrostatic coupling between the first band processing circuit and the third band processing circuit. This makes it possible, even in a case where the frequency of a harmonic of the first transmission signal outputted from the first transmission filter includes a pass band of the third reception filter, to suppress a situation in which the harmonic is superimposed on the third reception signal passing through the third reception filter. Therefore, it is possible to suppress signal interference between the first band processing circuit and the third band processing circuit.

Further, there may be provided, on the substrate, a fourth band processing circuit having a fourth transmission filter configured to filter a signal of a fourth frequency band, which is a signal of a different frequency band from the first, second and third frequency bands, and output the filtered signal as a fourth transmission signal, or a fourth reception filter configured to filter a signal of the fourth frequency band and output the filtered signal as a fourth reception signal. The fourth band processing circuit is not to be used at the same time as the first band processing circuit and the third band processing circuit when the wireless communication is performed and may be disposed between the first band processing circuit and the third band processing circuit in a plan view of the substrate.

As described above, by disposing the fourth band processing circuit, which is not used at the same time as the first band processing circuit and the third band processing circuit when wireless communication is performed, between the first band processing circuit and the third band processing circuit, it is possible to increase the distance between the first band processing circuit and the third band processing circuit and to suppress the electromagnetic field coupling and the electrostatic coupling between the first band processing circuit and the third band processing circuit. This makes it possible, even in a case where the frequency of a harmonic of the first transmission signal outputted from the first transmission filter includes a pass band of the third reception filter, to suppress a situation in which the harmonic is superimposed on the third reception signal passing through the third reception filter. Therefore, it is possible to suppress signal interference between the first band processing circuit and the third band processing circuit.

In addition, there may be provided, on the substrate, a first amplification circuit configured to output a signal of the first frequency band to the first band processing circuit and output a signal of the second frequency band to the second band processing circuit, and a second amplification circuit configured to output a signal of the third frequency band to the third band processing circuit and output a signal of the fourth frequency band to the fourth band processing circuit. Further, the above substrate may be constituted of a first substrate and a second substrate located adjacent to the first substrate, the first band processing circuit, the second band processing circuit and the first amplification circuit may be formed on the first substrate, and the third band processing circuit, the fourth band processing circuit and the second amplification circuit may be formed on the second substrate.

With this configuration, the distance between the first band processing circuit formed on the first substrate and the third band processing circuit formed on the second substrate can be increased to a distance at which the electromagnetic field coupling and electrostatic coupling hardly occur, and the signal interference between the first band processing circuit and the third band processing circuit can be suppressed. Further, since a predetermined number of band processing circuits and amplification circuits can be formed on each substrate and unitized as a unit, it is possible to improve the efficiency of circuit design.

The first amplification circuit may generate a harmonic included in the frequency band of the third reception signal and may be disposed at a position more distant than a position of the second band processing circuit relative to a position of the third band processing circuit as a reference.

According to this configuration, it is possible to suppress a situation in which the harmonic of the transmission signal generated from the first amplification circuit is superimposed on the third reception signal passing through the third reception filter, and to suppress signal interference between the first amplification circuit and the third band processing circuit.

The harmonic of the first transmission signal may be a third order harmonic.

According to this configuration, it is possible to suppress the signal interference between the first band processing circuit and the third band processing circuit even if the harmonic of the first transmission signal is a third order harmonic.

A communication device according to an aspect of the present disclosure may be constituted of a signal processing circuit configured to process a high frequency signal, and a front-end circuit formed by the aforementioned high frequency module.

This makes it possible to suppress signal interference between the bands in the communication device configured to wirelessly transmit and receive signals of different bands.

The high frequency module and the like of the present disclosure can suppress signal interference between respective bands when the signals of different bands are transmitted and received wirelessly.

BRIEF DESCRIPTION OF THE SEVERAL VIEWS OF THE DRAWINGS

FIG. 2 is a table showing usage bands and frequency bands of a high frequency module according to the first embodiment.

DETAILED DESCRIPTION

Figure 1:
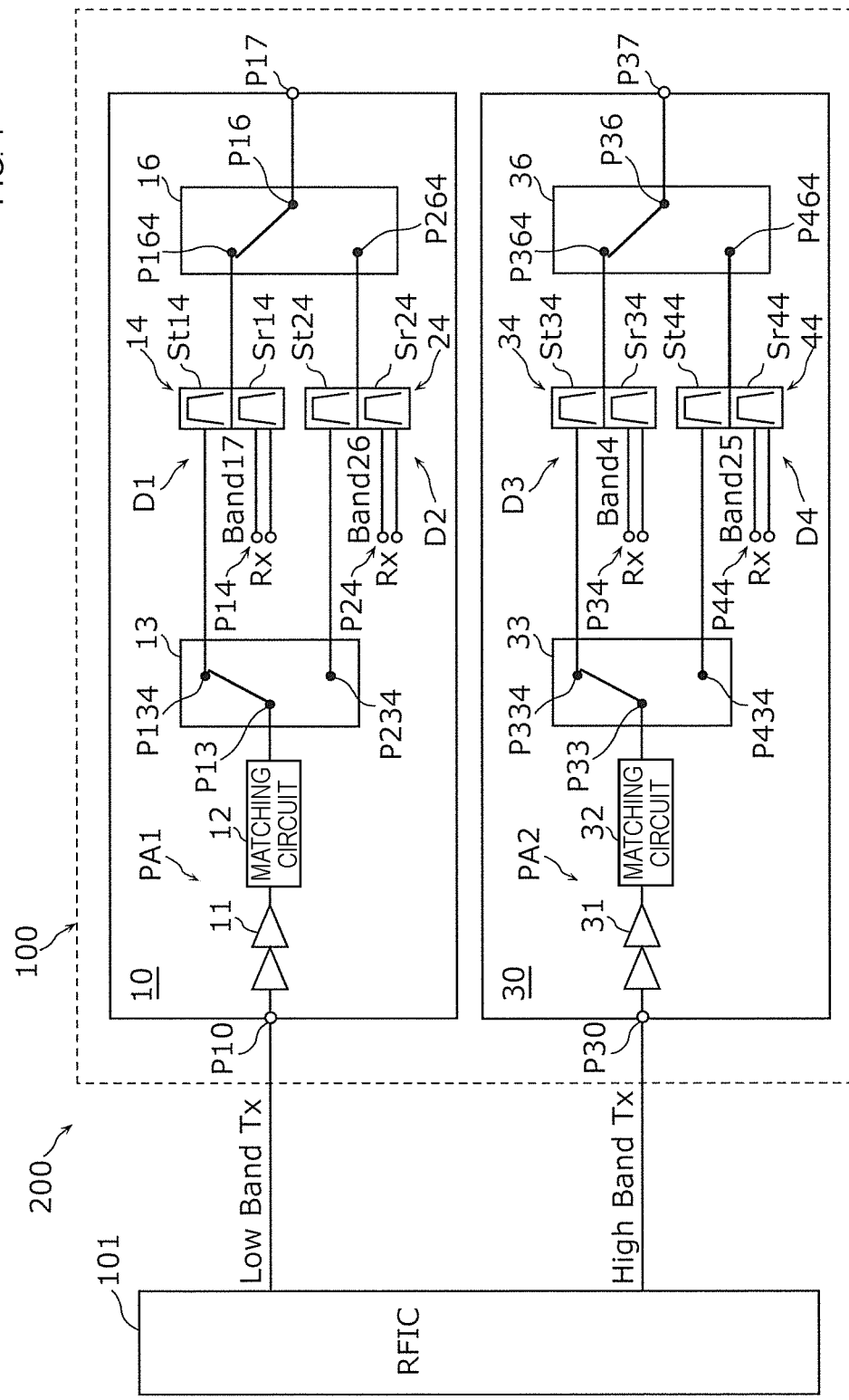
FIG. 1 is a circuit configuration diagram of a high frequency module and a communication device according to a first embodiment.

Hereinafter, embodiments of the present disclosure will be described in detail with reference to the embodiments and drawings. Note that each of the embodiments described below represents a comprehensive or specific example. Numerical values, shapes, materials, constituent elements, arrangement and connection modes of the constituent elements, and the like indicated in the following embodiments are merely examples and are not intended to limit the present disclosure. Of the constituent elements in the following embodiments, those that are not disclosed in the independent claims will be described as arbitrary constituent elements. In addition, sizes or the ratio of the sizes of the constituent elements illustrated in the drawings may not necessarily be given in a strict manner.

First Embodiment

[1-1. Configuration of High Frequency Module and Communication Device]

A high frequency module 100 according to a first embodiment performs carrier aggregation (CA) by wirelessly transmitting and receiving signals of multiple bands at the same time. The high frequency module 100 transmits and receives a high frequency signal (a signal of 700 MHz to 2700 MHz) according to the Long Term Evolution (LTE) standard, for example.

FIG. 1 is a circuit configuration of the high frequency module 100 and a communication device 200 according to the first embodiment. FIG. 2 is a table showing usage bands and frequency bands of the high frequency module 100.

The communication device 200 includes a signal processing circuit 101 and a front-end circuit constituted by the high frequency module 100.

The signal processing circuit 101 is, for example, a radio frequency integrated circuit (RFIC). The signal processing circuit 101 performs signal processing on a transmission signal inputted from a baseband signal processing circuit by up-converting or the like, and outputs a high frequency transmission signal generated through the above signal processing to the high frequency module 100.

The high frequency module 100 includes a low band transmission and reception unit 10 configured to transmit and receive a signal of a low frequency band (hereinafter, referred to as a low band), and a high band transmission and reception unit 30 configured to transmit and receive a signal of a frequency band higher than the low band (hereinafter, referred to as a high band). In this embodiment, as an example, the description will be given assuming that the frequency band of a signal transmitted and received by the low band transmission and reception unit 10 is a frequency range from 600 MHz to 1000 MHz, and the frequency band of a signal transmitted and received by the high band transmission and reception unit 30 is a frequency range from 1600 MHz to 2700 MHz.

The low band transmission and reception unit 10 includes an input terminal P10, a first amplification circuit PA1, a sub switch 13, a first band processing circuit D1, a second band processing circuit D2, a main switch 16, and an antenna terminal P17.

The input terminal P10 is connected to the signal processing circuit 101, and a transmission signal of the low band (from 600 MHz to 1000 MHz) is inputted from the signal processing circuit 101 to the input terminal P10. The antenna terminal P17 is connected to, for example, an antenna for the low band (not illustrated).

The first amplification circuit PA1 is constituted of an amplification element 11 and a matching circuit 12. The amplification element 11 amplifies the transmission signal of the low band inputted to the input terminal P10, and outputs the amplified transmission signal to the matching circuit 12. The matching circuit 12 includes, for example, an inductor and a capacitor, and matches impedance between the antenna side and the amplification element 11 side.

The sub switch 13 includes a common terminal P13 and a plurality of selection terminals P134 and P234. The common terminal P13 is connected to the matching circuit 12, the selection terminal P134 is connected to the first band processing circuit D1, and the selection terminal P234 is connected to the second band processing circuit D2. The main switch 16 includes a plurality of selection terminals P164 and P264, and a common terminal P16. The selection terminal P164 is connected to the first band processing circuit D1, the selection terminal P264 is connected to the second band processing circuit D2, and the common terminal P16 is connected to the antenna terminal P17. By switching each of the main switch 16 and the sub switch 13, any one of the first band processing circuit D1 and the second band processing circuit D2 is used as a band processing circuit in the low band transmission and reception unit 10. These switching operations are performed based on a control signal outputted from a control IC mounted in the high frequency module 100.

In accordance with the switching of these switches, the first amplification circuit PA1 outputs a signal of a first frequency band to the first band processing circuit D1, and outputs a signal of a second frequency band to the second band processing circuit D2. The first frequency band is, for example, a band corresponding to band 17 (700 MHz band) of the LTE standard, and the second frequency band is, for example, a band corresponding to band 26 (800 MHz band) of the LTE standard.

The first band processing circuit D1 includes a first transmission filter St14 configured to filter a signal of the first frequency band and output the filtered signal as a first transmission signal, and a first reception filter Sr14 configured to filter a signal of the first frequency band and output the filtered signal as a first reception signal. Specifically, the first band processing circuit D1 is a circuit provided between the main switch 16 and the sub switch 13 and is constituted of a first duplexer 14 and a matching element. The first duplexer 14 includes the first transmission filter St14 and the first reception filter Sr14.

The first transmission filter St14 is provided between the selection terminal P134 of the sub switch 13 and the selection terminal P164 of the main switch 16. The first transmission filter St14 is, for example, a surface acoustic wave (SAW) filter, where a frequency range from 704 MHz to 716 MHz is a pass band (see FIG. 2), and other bands than the pass band are attenuation bands.

The first reception filter Sr14 is provided between a reception terminal P14 and the selection terminal P164 of the main switch 16. The first reception filter Sr14 has a balanced-unbalanced conversion function and is connected to a reception circuit (not illustrated) through the reception terminal P14. The first transmission filter Sr14 is, for example, a SAW filter, where a frequency range from 734 MHz to 746 MHz is a pass band (see FIG. 2), and other bands than the pass band are attenuation bands. Although the configuration including two reception terminals P14 is described as an example, the configuration may include a single reception terminal P14.

The second band processing circuit D2 includes a second transmission filter St24 configured to filter a signal of the second frequency band and output the filtered signal as a second transmission signal, and a second reception filter Sr24 configured to filter a signal of the second frequency band and output the filtered signal as a second reception signal. Specifically, the second band processing circuit D2 is a circuit provided between the main switch 16 and the sub switch 13 and is constituted of a second duplexer 24 and a matching element. The second duplexer 24 includes the second transmission filter St24 and the second reception filter Sr24 described above.

The second transmission filter St24 is provided between the selection terminal P234 of the sub switch 13 and the selection terminal P264 of the main switch 16. The second transmission filter St24 is, for example, a SAW filter, where a frequency range from 814 MHz to 849 MHz is a pass band (see FIG. 2), and other bands than the pass band are attenuation bands.

The second reception filter Sr24 is provided between a reception terminal P24 and the selection terminal P264 of the main switch 16. The second reception filter Sr24 has a balanced-unbalanced conversion function and is connected to a reception circuit (not illustrated) through the reception terminal P24. The second transmission filter Sr24 is, for example, a SAW filter, where a frequency range from 859 MHz to 894 MHz is a pass band (see FIG. 2), and other bands than the pass band are attenuation bands. Although the configuration including two reception terminals P24 is described as an example, the configuration may include a single reception terminal P24.

The high band transmission and reception unit 30 has a configuration similar to that of the low band transmission and reception unit 10 and supports different bands for signals to be transmitted and received from those supported by the low band transmission and reception unit 10.

The high band transmission and reception unit 30 includes an input terminal P30, a second amplification circuit PA2, a sub switch 33, a third band processing circuit D3, a fourth band processing circuit D4, a main switch 36, and an antenna terminal P37.

The input terminal P30 is connected to the signal processing circuit 101, and a transmission signal of the high band (from 1600 MHz to 2700 MHz) is inputted from the signal processing circuit 101 to the input terminal P30. The antenna terminal P37 is connected, for example, to an antenna for the high band (not illustrated).

The second amplification circuit PA2 is constituted of an amplification element 31 and a matching circuit 32. The amplification element 31 amplifies the transmission signal of the high band inputted to the input terminal P30, and outputs the amplified transmission signal to the matching circuit 32. The matching circuit 32 includes, for example, an inductor and a capacitor, and matches impedance between the antenna side and the amplification element 31 side.

The sub switch 33 includes a common terminal P33 and a plurality of selection terminals P334 and P434. The common terminal P33 is connected to the matching circuit 32, the selection terminal P334 is connected to the third band processing circuit D3, and the selection terminal P434 is connected to the fourth band processing circuit D4. The main switch 36 includes multiple selection terminals P364 and P464, and a common terminal P36. The selection terminal P364 is connected to the third band processing circuit D3, the selection terminal P464 is connected to the fourth band processing circuit D4, and the common terminal P36 is connected to the antenna terminal P37. By switching each of the main switch 36 and the sub switch 33, any one of the third band processing circuit D3 and the fourth band processing circuit D4 is used as a band processing circuit in the high band transmission and reception unit 30. These switching operations are performed based on a control signal outputted from a control IC mounted in the high frequency module 100.

In accordance with the switching of these switches, the second amplification circuit PA2 outputs a signal of a third frequency band to the third band processing circuit D3, and outputs a signal of a fourth frequency band to the fourth band processing circuit D4. The third frequency band is, for example, a band corresponding to band 4 (1700 MHz band and 2100 MHz band) of the LTE standard, and the fourth frequency band is, for example, a band corresponding to band 25 (1800 MHz band and 1900 MHz band) of the LTE standard.

The third band processing circuit D3 includes a third transmission filter St34 configured to filter a signal of the third frequency band and output the filtered signal as a third transmission signal, and a third reception filter Sr34 configured to filter a signal of the third frequency band and output the filtered signal as a third reception signal. Specifically, the third band processing circuit D3 is a circuit provided between the main switch 36 and the sub switch 33 and is constituted of a third duplexer 34 and a matching element. The third duplexer 34 includes the third transmission filter St34 and the third reception filter Sr34 described above.

The third transmission filter St34 is provided between the selection terminal P334 of the sub switch 33 and the selection terminal P364 of the main switch 36. The third transmission filter St34 is, for example, a SAW filter, where a frequency range from 1710 MHz to 1755 MHz is a pass band (see FIG. 2), and other bands than the pass band are attenuation bands.

The third reception filter Sr34 is provided between a reception terminal P34 and the selection terminal P364 of the main switch 36. The third reception filter Sr34 has a balanced-unbalanced conversion function and is connected to a reception circuit (not illustrated) through the reception terminal P34. The third reception filter Sr34 is, for example, a SAW filter, where a frequency range from 2110 MHz to 2155 MHz is a pass band (see FIG. 2), and other bands than the pass band are attenuation bands. Although the configuration including two reception terminals P34 is described as an example, the configuration may include a single reception terminal P34.

The fourth band processing circuit D4 includes a fourth transmission filter St44 configured to filter a signal of the fourth frequency band and output the filtered signal as a fourth transmission signal, and a fourth reception filter Sr44 configured to filter a signal of the fourth frequency band and output the filtered signal as a fourth reception signal. Specifically, the fourth band processing circuit D4 is a circuit provided between the main switch 36 and the sub switch 33 and is constituted of a fourth duplexer 44 and a matching element. The fourth duplexer 44 includes the fourth transmission filter St44 and the fourth reception filter Sr44 described above.

The fourth transmission filter St44 is provided between the selection terminal P434 of the sub switch 33 and the selection terminal P464 of the main switch 36. The fourth transmission filter St44 is, for example, a SAW filter, where a frequency range from 1850 MHz to 1915 MHz is a pass band (see FIG. 2), and other bands than the pass band are attenuation bands.

The fourth reception filter Sr44 is provided between a reception terminal P44 and the selection terminal P464 of the main switch 36. The fourth reception filter Sr44 has a balanced-unbalanced conversion function and is connected to a reception circuit (not illustrated) through the reception terminal P44. The fourth reception filter Sr44 is, for example, a SAW filter, where a frequency range from 1930 MHz to 1995 MHz is a pass band (see FIG. 2), and other bands than the pass band are attenuation bands. Although the configuration including two reception terminals P44 is described as an example, the configuration may include a single reception terminal P44.

[1-2. Operations of High Frequency Module]

Next, operations of the high frequency module 100 having the above-discussed configuration will be described.

In the high frequency module 100, for example, when a signal is to be transmitted and received in band 17, the control IC outputs a control signal to the sub switch 13 and the main switch 16 so as to connect the common terminal P13 and the selection terminal P134 and connect the common terminal P16 and the selection terminal P164.

With these connections, a signal of the first frequency band inputted to the input terminal P10 is amplified by the amplification element 11, then passes through the matching circuit 12 and the sub switch 13, is filtered by the first transmission filter St14, and is outputted as the first transmission signal. Then, the first transmission signal is outputted to an antenna through the main switch 16 and the antenna terminal P17. On the other hand, a reception signal received by the antenna passes through the antenna terminal P17 and the main switch 16, is filtered by the first reception filter Sr14, and is outputted as the first reception signal. The first reception signal is then outputted to the reception circuit through the reception terminal P14.

In order to enable carrier aggregation, the high frequency module 100 according to the present embodiment transmits and receives signals in a band (e.g., band 4) different from band 17 at the same time.

In the case where signals are to be transmitted and received in band 4, the control IC outputs a control signal to the sub switch 33 and the main switch 36 so as to connect the common terminal P33 and the selection terminal P334 and connect the common terminal P36 and the selection terminal P364.

With these connections, a signal of the third frequency band inputted to the input terminal P30 is amplified by the amplification element 31, then passes through the matching circuit 32 and the sub switch 33, is filtered by the third transmission filter St34, and is outputted as the third transmission signal. The third transmission signal is then outputted to an antenna through the main switch 36 and the antenna terminal P37. On the other hand, a reception signal received by the antenna passes through the antenna terminal P37 and the main switch 36, is filtered by the third reception filter Sr34, and is outputted as the third reception signal. The third reception signal is then outputted to the reception circuit through the reception terminal P34.

Since each of the main switch 16 and the sub switch 13 performs an exclusive switching operation, the second band processing circuit D2 is not used when the first band processing circuit D1 is being used. Further, since each of the main switch 36 and the sub switch 33 performs an exclusive switching operation, the fourth band processing circuit D4 is not used when the third band processing circuit D3 is being used.

In other words, in the high frequency module 100, when wireless communication is performed in band 17 and band 4, the first band processing circuit D1 can be used at the same time as the third band processing circuit D3. In this case, the second band processing circuit D2 is not used at the same time as the first band processing circuit D1 and/or the third band processing circuit D3, and the fourth band processing circuit D4 is not used at the same time as the first band processing circuit D1 and/or the third band processing circuit D3.

Here, when attention is paid to band 17 and band 4, a value obtained by multiplying the pass band (704 MHz to 716 MHz) of the first transmission filter St14 by three overlaps with a value of the pass band (2110 MHz to 2155 MHz) of the third reception filter Sr34. Accordingly, in the high frequency module 100, when wireless communication is performed at the same time in band 17 and band 4, and the first band processing circuit D1 and the third band processing circuit D3 are used at the same time, a harmonic of the first transmission signal outputted from the first transmission filter St14 may pass through the third reception filter Sr34 to be superimposed on the third reception signal.

Accordingly, since the high frequency module 100 according to the present embodiment has the following structure, a situation in which the harmonic of the transmission signal outputted therefrom is superimposed on the reception signal is suppressed.

[1-3. Circuit Arrangement of High Frequency Module]

Figure 3:
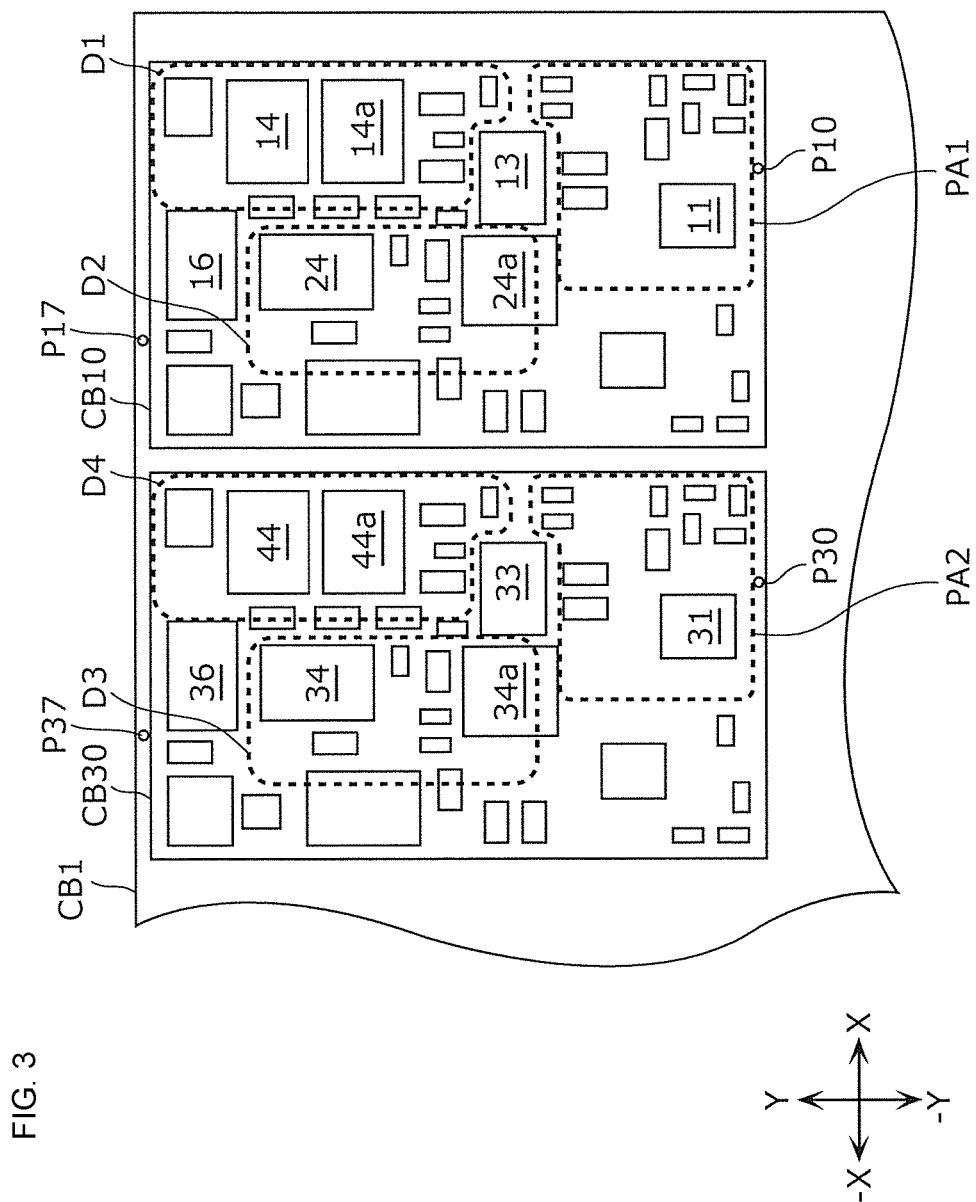
FIG. 3 is a plan view illustrating a circuit arrangement of a high frequency module according to the first embodiment.

FIG. 3 is a plan view illustrating a circuit arrangement of the high frequency module 100. A broken line in FIG. 3 indicates an area of each of various circuits.

In this high frequency module 100, as illustrated in FIG. 3, the first amplification circuit PA1, the first band processing circuit D1, and the second band processing circuit D2 are formed on a first substrate CB10. While taking the center of the first substrate CB10 as a reference, the first amplification circuit PA1 is located on the positive side in an X direction and on the negative side in a Y direction, the first band processing circuit D1 is located on the positive side in the X direction and on the positive side in the Y direction, and the second band processing circuit D2 is located on the negative side in the X direction and on the positive side in the Y direction.

In addition, in the high frequency module 100, the second amplification circuit PA2, the third band processing circuit D3, and the fourth band processing circuit D4 are formed on a second substrate CB30. While taking the center of the second substrate CB30 as a reference, the second amplification circuit PA2 is located on the positive side in the X direction and on the negative side in the Y direction, the third band processing circuit D3 is located on the negative side in the X direction and on the positive side in the Y direction, and the fourth band processing circuit D4 is located on the positive side in the X direction and on the positive side in the Y direction.

The first substrate CB10 and the second substrate CB30 are provided on a main substrate CB1 and are adjacent to each other. Although the first substrate CB10 and the second substrate CB30 are provided as different entities in FIG. 3, they are not limited thereto, and may be formed of an integrated substrate.

To be specific, as illustrated in FIG. 3, the first amplification circuit PA1 including the amplification element 11 and the matching circuit, the first band processing circuit D1 including the first duplexer 14 and the matching element, and the second band processing circuit D2 including the second duplexer 24 and the matching element are formed on the first substrate CB10. In addition, on the first substrate CB10, the input terminal P10 and the antenna terminal P17 are formed, and the sub switch 13, the main switch 16, other duplexers 14a and 24a, and various electrical elements are mounted.

The second amplification circuit PA2 including the amplification element 31 and the matching circuit, the third band processing circuit D3 including the third duplexer 34 and the matching element, and the fourth band processing circuit D4 including the fourth duplexer 44 and the matching element are formed on the second substrate CB30. In addition, on the second substrate CB30, the input terminal P30 and the antenna terminal P37 are formed, and the sub switch 33, the main switch 36, other duplexers 34a and 44a, and various electrical elements are mounted.

In this embodiment, the second band processing circuit D2 is disposed between the first band processing circuit D1 and the third band processing circuit D3 in a plan view of the main substrate CB1 (when the main substrate CB1 is seen from a thickness direction thereof). Further, the fourth band processing circuit D4 is disposed between the first band processing circuit D1 and the third band processing circuit D3 in the plan view of the main substrate CB1. More specifically, between the first duplexer 14 and the third duplexer 34, the second band processing circuit D2 and the fourth band processing circuit D4 are disposed.

As described above, by disposing, between the first band processing circuit D1 and the third band processing circuit D3, another circuit such as the second band processing circuit D2 or the fourth band processing circuit D4, it is possible to increase a distance between the first band processing circuit D1 and the third band processing circuit D3, and to suppress the electromagnetic field coupling and the electrostatic coupling between the first band processing circuit D1 and the third band processing circuit D3. This makes it possible, even in a case where the frequency of a harmonic of the first transmission signal outputted from the first transmission filter St14 includes a pass band of the third reception filter Sr34, to suppress a situation in which the harmonic is superimposed on the third reception signal passing through the third reception filter Sr34. Accordingly, it is possible to suppress signal interference between the first band processing circuit D1 and the third band processing circuit D3.

[1-4. Effects and Others]

The high frequency module 100 according to the present embodiment includes, on the substrate CB1, the first band processing circuit D1 having the first transmission filter St14 configured to filter a signal of the first frequency band and output the filtered signal as the first transmission signal, and the first reception filter Sr14 configured to filter a signal of the first frequency band and output the filtered signal as the first reception signal; the second band processing circuit D2 having the second transmission filter St24 configured to filter a signal of the second frequency band and output the filtered signal as the second transmission signal, and the second reception filter Sr24 configured to filter a signal of the second frequency band and output the filtered signal as the second reception signal; and the third band processing circuit D3 having the third transmission filter St34 configured to filter a signal of the third frequency band and output the filtered signal as the third transmission signal, and the third reception filter Sr34 configured to filter a signal of the third frequency band and output the filtered signal as the third reception signal. The first band processing circuit D1 is used at the same time as the third band processing circuit D3 when wireless communication is performed, and the frequency of the harmonic of the first transmission signal is included in the frequency band of the third reception signal. The second band processing circuit D2 is not used at the same time as the first band processing circuit D1 and the third band processing circuit D3 when wireless communication is performed and is disposed between the first band processing circuit D1 and the third band processing circuit D3 in the plan view of the substrate CB1.

As described above, by disposing the second band processing circuit D2 between the first band processing circuit D1 and the third band processing circuit D3, it is possible to increase the distance between the first band processing circuit D1 and the third band processing circuit D3, and to suppress the electromagnetic field coupling and the electrostatic coupling between the first band processing circuit D1 and the third band processing circuit D3. This makes it possible, even in a case where the frequency of a harmonic of the first transmission signal outputted from the first transmission filter St14 includes a pass band of the third reception filter Sr34, to suppress a situation in which the harmonic is superimposed on the third reception signal passing through the third reception filter Sr34. Accordingly, it is possible to suppress signal interference between the first band processing circuit D1 and the third band processing circuit D3. Further, since the second band processing circuit D2 is not used at the same time as the first band processing circuit D1 and the third band processing circuit D3 when wireless communication is performed, a situation in which a harmonic outputted from the second band processing circuit D2 is superimposed on the third reception signal can be suppressed. Further, even in a case where the high frequency module 100 is miniaturized to increase the degree of integration, it is possible to suppress the signal interference between the bands according to the above configuration.

Further, there may be provided, on the substrate CB1 of the high frequency module 100, the fourth band processing circuit D4 having the fourth transmission filter St44 configured to filter a signal of the fourth frequency band and output the filtered signal as the fourth transmission signal, and the fourth reception filter Sr44 configured to filter a signal of the fourth frequency band and output the filtered signal as the fourth reception signal. The fourth band processing circuit D4 is not to be used at the same time as the first band processing circuit D1 and the third band processing circuit D3 when wireless communication is performed and may be disposed between the first band processing circuit D1 and the third band processing circuit D3 in the plan view of the substrate CB1.

As described above, by disposing the fourth band processing circuit D4 between the first band processing circuit D1 and the third band processing circuit D3, it is possible to increase the distance between the first band processing circuit D1 and the third band processing circuit D3, and to suppress the electromagnetic field coupling and the electrostatic coupling between the first band processing circuit D1 and the third band processing circuit D3. This makes it possible, even in a case where the frequency of a harmonic of the first transmission signal outputted from the first transmission filter St14 includes a pass band of the third reception filter Sr34, to suppress a situation in which the harmonic is superimposed on the third reception signal passing through the third reception filter Sr34. Accordingly, it is possible to suppress signal interference between the first band processing circuit D1 and the third band processing circuit D3. Further, since the fourth band processing circuit D4 is not used at the same time as the first band processing circuit D1 and the third band processing circuit D3 when wireless communication is performed, a situation in which a harmonic outputted from the fourth band processing circuit D4 is superimposed on the third reception signal can be suppressed.

Second Embodiment

A high frequency module 100A according to a second embodiment is different from the high frequency module of the first embodiment in that a second band processing circuit D2 is used at the same time as a first band processing circuit D1 and a third band processing circuit D3 when wireless communication is performed. This high frequency module 100A is characterized in that the frequencies of a fundamental wave and a harmonic of a second transmission signal are not included in a frequency band of a third reception signal.

Figure 4:
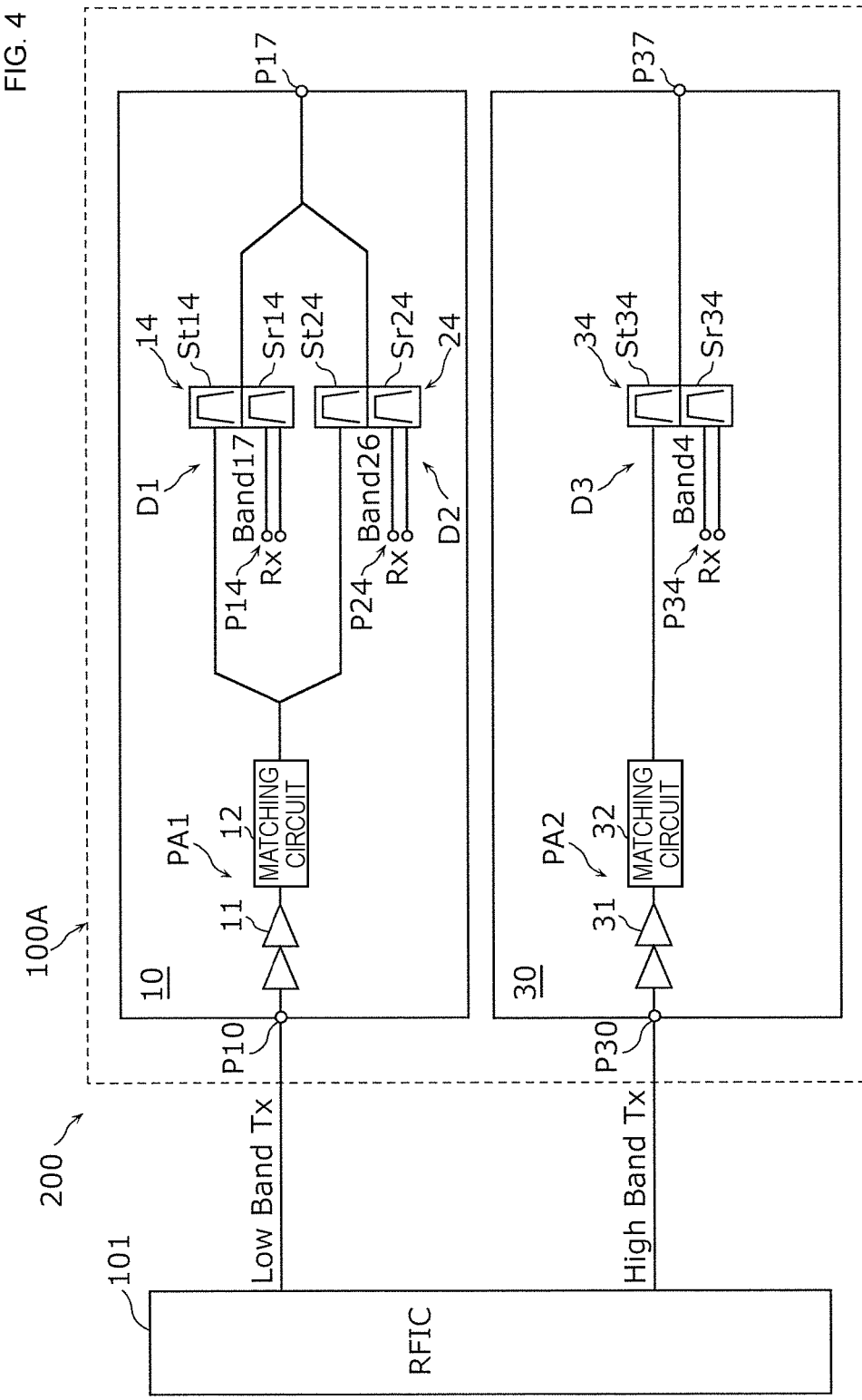
FIG. 4 is a circuit configuration diagram of a high frequency module and a communication device according to a second embodiment.
Figure 5:
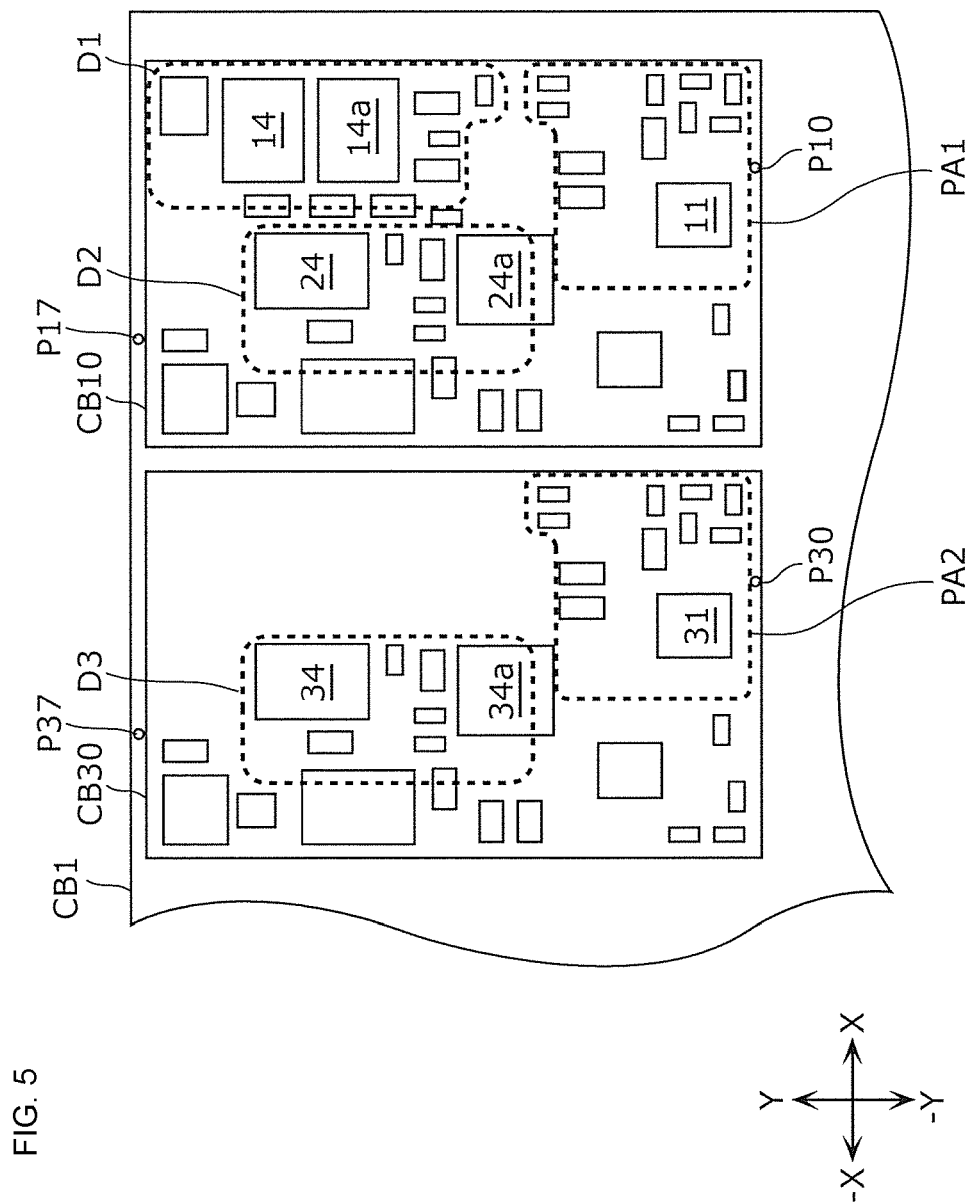
FIG. 5 is a plan view illustrating a circuit arrangement of a high frequency module according to the second embodiment.

FIG. 4 illustrates a circuit configuration of the high frequency module 100A and a communication device 200. FIG. 5 is a plan view illustrating a circuit arrangement of the high frequency module 100A.

The high frequency module 100A includes a low band transmission and reception unit 10 and a high band transmission and reception unit 30.

The low band transmission and reception unit 10 includes an input terminal P10, a first amplification circuit PA1, the first band processing circuit D1, the second band processing circuit D2 and an antenna terminal P17. The first amplification circuit PA1 is constituted of an amplification element 11 and a matching circuit 12.

On a path between the matching circuit 12 and the antenna terminal P17, the first band processing circuit D1 and the second band processing circuit D2 are disposed in parallel. The first amplification circuit PA1 outputs signals of a first frequency band and a second frequency band to the first band processing circuit D1 and the second band processing circuit D2, respectively. The first frequency band is a band corresponding to band 17 (700 MHz band), and the second frequency band is a band corresponding to band 26 (800 MHz band).

The first band processing circuit D1 includes a first transmission filter St14 configured to filter a signal of the first frequency band and output the filtered signal as a first transmission signal, and a first reception filter Sr14 configured to filter a signal of the first frequency band and output the filtered signal as a first reception signal. The first transmission filter St14 has a pass band of a frequency range from 704 MHz to 716 MHz, and the first reception filter Sr14 has a pass band of a frequency range from 734 MHz to 746 MHz.

The second band processing circuit D2 includes a second transmission filter St24 configured to filter a signal of the second frequency band and output the filtered signal as a second transmission signal, and a second reception filter Sr24 configured to filter a signal of the second frequency band and output the filtered signal as a second reception signal. The second transmission filter St24 has a pass band of a frequency range from 814 MHz to 849 MHz, and the second reception filter Sr24 has a pass band of a frequency range from 859 MHz to 894 MHz.

The high band transmission and reception unit 30 includes an input terminal P30, a second amplification circuit PA2, the third band processing circuit D3 and an antenna terminal P37. The second amplification circuit PA2 is constituted of an amplification element 31 and a matching circuit 32.

On a path between the matching circuit 32 and the antenna terminal P37, the third band processing circuit D3 is disposed. The second amplification circuit PA2 outputs a signal of a third frequency band to the third band processing circuit D3. The third frequency band is a band corresponding to band 4 (1700 MHz band and 2100 MHz band).

The third band processing circuit D3 includes a third transmission filter St34 configured to filter a signal of the third frequency band and output the filtered signal as a third transmission signal, and a third reception filter Sr34 configured to filter a signal of the third frequency band and output the filtered signal as a third reception signal. The third transmission filter St34 has a pass band of a frequency range from 1710 MHz to 1755 MHz, and the third reception filter Sr34 has a pass band of a frequency range from 2110 MHz to 2155 MHz.

In the high frequency module 100A, in a case where a signal is transmitted in band 17, a signal of the first frequency band inputted to the input terminal P10 is amplified by the amplification element 11, then passes through the matching circuit 12, is filtered by the first transmission filter St14, and is outputted as the first transmission signal. The first transmission signal is then outputted to an antenna through the antenna terminal P17.

In a case where a signal is received in band 4, a reception signal received by an antenna passes through the antenna terminal P37 and is filtered by the third reception filter Sr34 to be outputted as the third reception signal. The third reception signal is then outputted to a reception circuit through a reception terminal P34.

In this embodiment, in the case where wireless communication is performed in band 17 and band 4, the first band processing circuit D1 is used at the same times as the third band processing circuit D3. Further, the high frequency module 100A does not include the main switch 16 and the sub switch 13 as discussed in the first embodiment, and the second band processing circuit D2 can be used at the same time as the first band processing circuit D1 and the third band processing circuit D3.

However, in the high frequency module 100A, the respective bands are so selected in advance that an output of the second band processing circuit D2 for processing a signal of the low band is not inputted to the third band processing circuit D3 for processing a signal of the high band. In other words, the bands are selected so that the frequencies of a fundamental wave and a harmonic of the second transmission signal are not included in the frequency band of the third reception signal.

Also, in this embodiment, in the case where wireless communication is performed at the same time in band 17 and band 4, and the first band processing circuit D1 and the third band processing circuit D3 are used at the same time, a harmonic of the first transmission signal outputted from the first transmission filter St14 may pass through the third reception filter Sr34 to be superimposed on the third reception signal.

As such, the second band processing circuit D2 of the present embodiment is disposed between the first band processing circuit D1 and the third band processing circuit D3 in a plan view of a substrate CB1 (See FIG. 5). As described above, by disposing the second band processing circuit D2 between the first band processing circuit D1 and the third band processing circuit D3, it is possible to increase the distance between the first band processing circuit D1 and the third band processing circuit D3, and to suppress the electromagnetic field coupling and the electrostatic coupling between the first band processing circuit D1 and the third band processing circuit D3. This makes it possible, even in a case where the frequency of a harmonic of the first transmission signal outputted from the first transmission filter St14 includes a pass band of the third reception filter Sr34, to suppress a situation in which the harmonic is superimposed on the third reception signal passing through the third reception filter Sr34. Accordingly, it is possible to suppress signal interference between the first band processing circuit D1 and the third band processing circuit D3. Further, since the frequencies of the fundamental wave and the harmonic of the second transmission signal of the second band processing circuit D2 are not included in the frequency band of the third reception signal, it is possible to suppress a situation in which the harmonic outputted from the second band processing circuit D2 is superimposed on the third reception signal.

In preparation for the case in which the second band processing circuit D2 and the first band processing circuit D1 are used at the same time, it is desirable that the following relations are satisfied: the frequencies of the fundamental wave and the harmonic of the second transmission signal are not included in the frequency band of the first reception signal; and the frequencies of the fundamental wave and the harmonic of the first transmission signal are not included in the frequency band of the second reception signal. Further, in preparation for the case in which the second band processing circuit D2 and the third band processing circuit D3 are used at the same time, it is desirable that the following relation is satisfied: the frequencies of the fundamental wave and the harmonic of the third transmission signal are not included in the frequency band of the second reception signal.

Third Embodiment

A high frequency module 100B according to a third embodiment differs from the high frequency module of the second embodiment in that a band processing circuit located between a first band processing circuit D1 and a third band processing circuit D3 is included in a high band transmission and reception unit 30. Although, in the high frequency module 100B, the band processing circuit located between the first band processing circuit D1 and the third band processing circuit D3 is described as a fourth band processing circuit D4, the fourth band processing circuit D4 may be referred to as a second band processing circuit.

Figure 6:
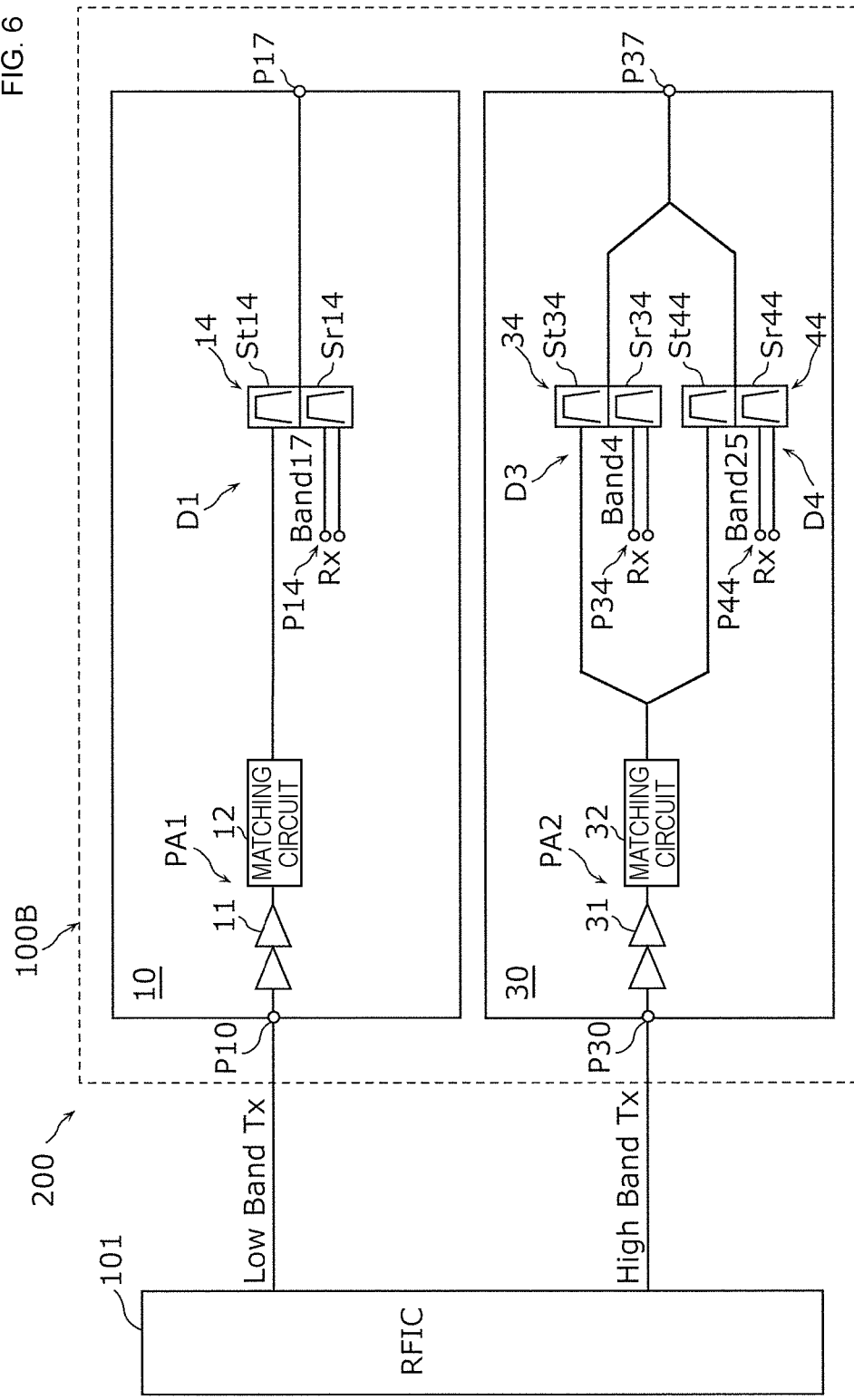
FIG. 6 is a circuit configuration diagram of a high frequency module and a communication device according to a third embodiment.
Figure 7:
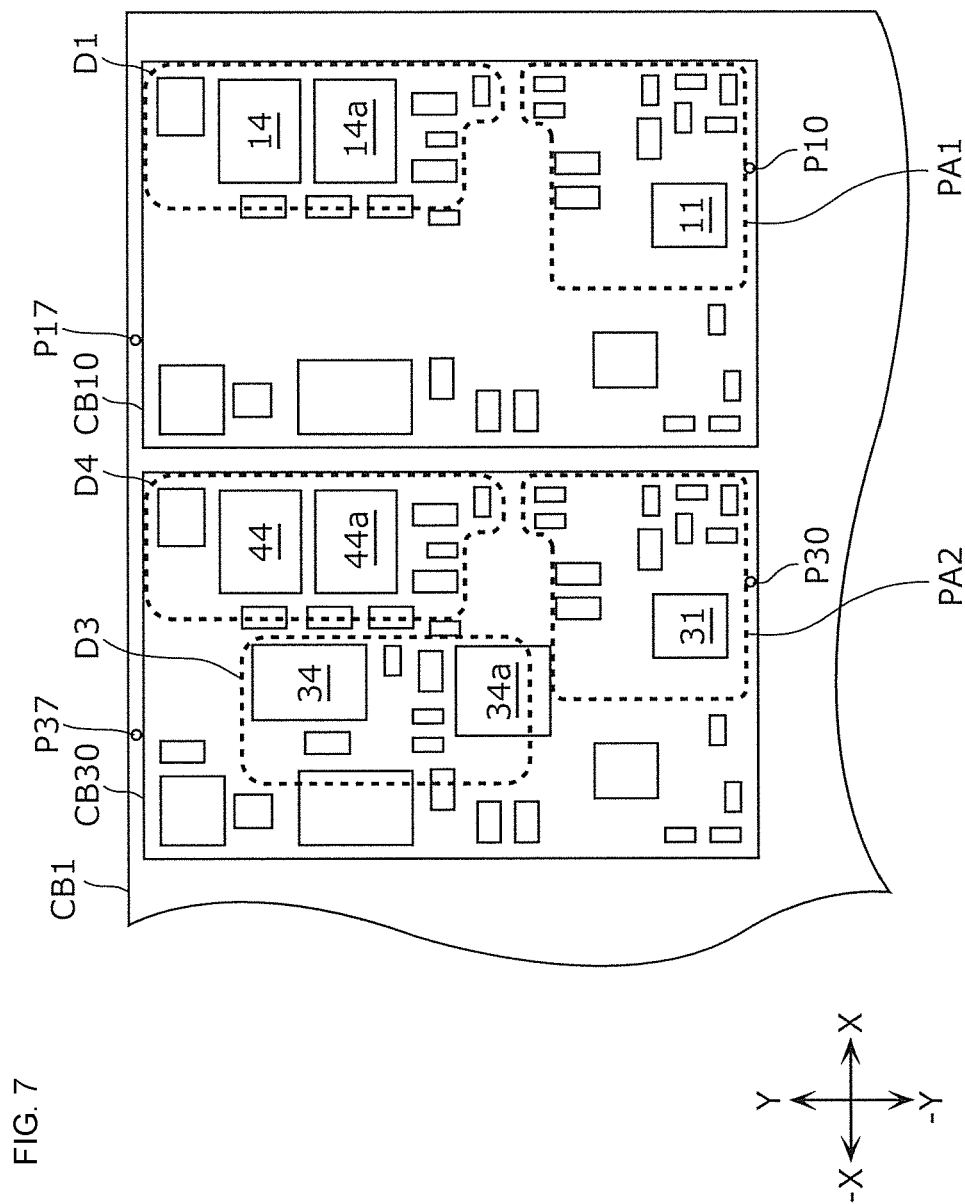
FIG. 7 is a plan view illustrating a circuit arrangement of a high frequency module according to the third embodiment.

FIG. 6 illustrates a circuit configuration of the high frequency module 100B and a communication device 200. FIG. 7 is a plan view illustrating a circuit arrangement of the high frequency module 100B.

The high frequency module 100B includes a low band transmission and reception unit 10 and the high band transmission and reception unit 30.

The low band transmission and reception unit 10 includes an input terminal P10, a first amplification circuit PA1, the first band processing circuit D1, and an antenna terminal P17. The first amplification circuit PA1 is constituted of an amplification element 11 and a matching circuit 12.

On a path between the matching circuit 12 and the antenna terminal P17, the first band processing circuit D1 is disposed. The first amplification circuit PA1 outputs a signal of a first frequency band to the first band processing circuit D1. The first frequency band is a band corresponding to band 17 (700 MHz band).

The first band processing circuit D1 includes a first transmission filter St14 configured to filter a signal of the first frequency band and output the filtered signal as a first transmission signal, and a first reception filter Sr14 configured to filter a signal of the first frequency band and output the filtered signal as a first reception signal. The first transmission filter St14 has a pass band of a frequency range from 704 MHz to 716 MHz, and the first reception filter Sr14 has a pass band of a frequency range from 734 MHz to 746 MHz.

The high band transmission and reception unit 30 includes an input terminal P30, a second amplification circuit PA2, the third band processing circuit D3, the fourth band processing circuit D4, and an antenna terminal P37. The second amplification circuit PA2 is constituted of an amplification element 31 and a matching circuit 32.

On a path between the matching circuit 32 and the antenna terminal P37, the third band processing circuit D3 and the fourth band processing circuit D4 are disposed in parallel. The second amplification circuit PA2 outputs a signal of a third frequency band and a signal of a fourth frequency band to the third band processing circuit D3 and the fourth band processing circuit D4, respectively. The third frequency band is a band corresponding to band 4 (1700 MHz band and 2100 MHz band), and the fourth frequency band is a band corresponding to band 25 (1800 MHz band and 1900 MHz band).

The third band processing circuit D3 includes a third transmission filter St34 configured to filter a signal of the third frequency band and output the filtered signal as a third transmission signal, and a third reception filter Sr34 configured to filter a signal of the third frequency band and output the filtered signal as a third reception signal. The third transmission filter St34 has a pass band of a frequency range from 1710 MHz to 1755 MHz, and the third reception filter Sr34 has a pass band of a frequency range from 2110 MHz to 2155 MHz.

The fourth band processing circuit D4 includes a fourth transmission filter St44 configured to filter a signal of the fourth frequency band and output the filtered signal as a fourth transmission signal, and a fourth reception filter Sr44 configured to filter a signal of the fourth frequency band and output the filtered signal as a fourth reception signal. The fourth transmission filter St44 has a pass band of a frequency range from 1850 MHz to 1915 MHz, and the fourth reception filter Sr44 has a pass band of a frequency range from 1930 MHz to 1995 MHz.

In the high frequency module 100B, in a case where a signal is transmitted in band 17, a signal of the first frequency band inputted to the input terminal P10 is amplified by the amplification element 11, then passes through the matching circuit 12, is filtered by the first transmission filter St14, and is outputted as the first transmission signal. The first transmission signal is then outputted to an antenna through the antenna terminal P17.

In a case where a signal is received in band 4, a reception signal received by an antenna passes through the antenna terminal P37 and is filtered by the third reception filter Sr34 to be outputted as the third reception signal. The third reception signal is then outputted to a reception circuit through a reception terminal P34.

In this embodiment, in the case where wireless communication is performed in band 17 and band 4, the first band processing D1 is used at the same times as the third band processing circuit D3. Further, the high frequency module 100B does not include the main switch 36 and the sub switch 33 as discussed in the first embodiment, and the fourth band processing circuit D4 can be used at the same time as the first band processing circuit D1 and the third band processing circuit D3.

Note that, however, in the high frequency module 100B, the respective bands are so selected in advance that an output of the fourth band processing circuit D4 for processing a signal of the low band is not inputted to the third band processing circuit D3 for processing a signal of the high band. In other words, the bands are selected so that the frequencies of a fundamental wave and a harmonic of the fourth transmission signal are not included in the frequency band of the third reception signal.

Also, in this embodiment, in the case where wireless communication is performed at the same time in band 17 and band 4, and the first band processing circuit D1 and the third band processing circuit D3 are used at the same time, a harmonic of the first transmission signal outputted from the first transmission filter St14 may pass through the third reception filter Sr34 to be superimposed on the third reception signal.

As such, the fourth band processing circuit D4 of the present embodiment is disposed between the first band processing circuit D1 and the third band processing circuit D3 in a plan view of a substrate CB1 (See FIG. 7). As described above, by disposing the fourth band processing circuit D4 between the first band processing circuit D1 and the third band processing circuit D3, it is possible to increase the distance between the first band processing circuit D1 and the third band processing circuit D3, and to suppress the electromagnetic field coupling and the electrostatic coupling between the first band processing circuit D1 and the third band processing circuit D3. This makes it possible, even in a case where the frequency of a harmonic of the first transmission signal outputted from the first transmission filter St14 includes a pass band of the third reception filter Sr34, to suppress a situation in which the harmonic is superimposed on the third reception signal passing through the third reception filter Sr34. Accordingly, it is possible to suppress signal interference between the first band processing circuit D1 and the third band processing circuit D3. Further, since the frequencies of the fundamental wave and the harmonic of the fourth transmission signal of the fourth band processing circuit D4 are not included in the frequency band of the third reception signal, it is possible to suppress a situation in which the harmonic outputted from the fourth band processing circuit D4 is superimposed on the third reception signal.

In preparation for the case in which the fourth band processing circuit D4 and the first band processing circuit D1 are used at the same time, it is desirable that the following relations are satisfied: the frequencies of the fundamental wave and the harmonic of the fourth transmission signal are not included in the frequency band of the first reception signal; and the frequencies of the fundamental wave and the harmonic of the first transmission signal are not included in the frequency band of the fourth reception signal. Further, in preparation for the case in which the fourth band processing circuit D4 and the third band processing circuit D3 are used at the same time, it is desirable that the following relation is satisfied: the frequencies of the fundamental wave and the harmonic of the third transmission signal are not included in the frequency band of the fourth reception signal.

Other Embodiments and the Like

Although the high frequency modules 100, 100A and 100B, and the communication device 200 according to the embodiments of the present disclosure have been described thus far, the present disclosure is not limited to the above embodiments. For example, the modes in which the following modifications are applied to the above-described embodiments may also be included in the present disclosure.

Although the high frequency module 100 according to the first embodiment is configured such that the fourth band processing circuit D4 is not used simultaneously with the first band processing circuit D1 and the third band processing circuit D3, the present disclosure is not limited thereto. For example, in the high frequency module 100, the sub switch 33 and the main switch 36 may be removed, and the third band processing circuit D3 and the fourth band processing circuit D4 may be disposed in parallel on a path between the matching circuit 32 and the antenna terminal P37. In this case, it is possible to secure isolation between the first band processing circuit D1 and the third band processing circuit D3 by selecting the bands in such a manner that the frequencies of the fundamental wave and the harmonic of the fourth transmission signal of the fourth band processing circuit D4 are not included in the frequency bands of the first reception signal, the second reception signal and the third reception signal, and that the frequencies of the fundamental wave and the harmonic of each of the first transmission signal, the second transmission signal and the third transmission signal are not included in the frequency band of the fourth reception signal.

Further, the fourth band processing circuit D4 may be added in the high frequency module 100A of the second embodiment, and the third band processing circuit D3 and the fourth band processing circuit D4 may be arranged in parallel to each other on a path between the matching circuit 32 and the antenna terminal P37. In this case, it is possible to secure isolation between the first band processing circuit D1 and the third band processing circuit D3 by selecting the bands in such a manner that the frequencies of the fundamental wave and the harmonic of the fourth transmission signal of the fourth band processing circuit D4 are not included in the frequency bands of the first reception signal, the second reception signal and the third reception signal, and that the frequencies of the fundamental wave and the harmonic of each of the first transmission signal, the second transmission signal and the third transmission signal are not included in the frequency band of the fourth reception signal.

Furthermore, the fourth band processing circuit D4 may be added in the high frequency module 100A of the second embodiment, and the third band processing circuit D3 and the fourth band processing circuit D4 may be connected to the matching circuit 32 and the antenna terminal P37 via the sub switch 33 and the main switch 36, as illustrated in FIG. 1. In this case, since the fourth band processing circuit D4 is so configured as not to be used simultaneously with the first band processing circuit D1 and the third band processing circuit D3, isolation between the first band processing circuit D1 and the third band processing circuit D3 can be secured.

Although, in the first to third embodiments, the case in which the high frequency module includes three or four band processing circuits is described, the high frequency module may include five or more band processing circuits. In such case, of five or more band processing circuits, three or four band processing circuits may have the relationship among one another as described in the first, second, or third embodiment.

Although the high frequency module 100 configured to transmit and receive signals in two bands, that is, in a low band and a high band at the same time is described in the first embodiment, the disclosure is not limited thereto, and the first embodiment may provide a high frequency module configured to transmit and receive signals at the same time in three or more bands different from each other. For example, even in a case where a second order harmonic of a transmission signal in a low band (600 MHz to 1000 MHz) includes a frequency component of a middle band (1400 MHz to 1600 MHz), by disposing a second band processing circuit for the low band between a first band processing circuit for the low band and a third band processing circuit for the middle band, signal interference between the bands can be suppressed.

Further, although, in the embodiments, a duplexer is used as an example of an element included in a band processing circuit, the disclosure is not limited thereto, and a multiplexer that bundles a plurality of transmission filters may be used or a multiplexer that bundles a plurality of reception filters may be used.

The high frequency module 100 may include a transmission and reception unit configured to transmit and receive signals based on a standard other than the LTE standard (e.g., W-CDMA standard). Further, although a SAW filter is used as an example of a transmission filter and a reception filter, the disclosure is not limited thereto, and a bulk acoustic wave (BAW) filter may be used.

INDUSTRIAL APPLICABILITY

The present disclosure can be widely applicable, as a high frequency module and a communication device required to be highly isolated, to cellular phones and communication equipment of base stations and the like.

REFERENCE SIGNS LIST

10 LOW BAND TRANSMISSION AND RECEPTION UNIT
30 HIGH BAND TRANSMISSION AND RECEPTION UNIT
11, 31 AMPLIFICATION ELEMENT
12, 32 MATCHING CIRCUIT
13, 33 SUB SWITCH
14 FIRST DUPLEXER
24 SECOND DUPLEXER
34 THIRD DUPLEXER
44 FOURTH DUPLEXER
14a, 24a, 34a, 44a OTHER DUPLEXERS
16, 36 MAIN SWITCH
100, 100A, 100B HIGH FREQUENCY MODULE
101 SIGNAL PROCESSING CIRCUIT
200 COMMUNICATION DEVICE
CB1 MAIN SUBSTRATE
CB10 FIRST SUBSTRATE
CB30 SECOND SUBSTRATE
D1 FIRST BAND PROCESSING CIRCUIT
D2 SECOND BAND PROCESSING CIRCUIT
D3 THIRD BAND PROCESSING CIRCUIT
D4 FOURTH BAND PROCESSING CIRCUIT
PA1 FIRST AMPLIFICATION CIRCUIT
PA2 SECOND AMPLIFICATION CIRCUIT
P10, P30 INPUT TERMINAL
P14, P24, P34, P44 RECEPTION TERMINAL
P17, P37 ANTENNA TERMINAL
P13, P16, P33, P36 COMMON TERMINAL
P134, P234, P164, P264, P334, P434, P364, P464 SELECTION TERMINAL
St14 FIRST TRANSMISSION FILTER
St24 SECOND TRANSMISSION FILTER
St34 THIRD TRANSMISSION FILTER
St44 FOURTH TRANSMISSION FILTER
Sr14 FIRST RECEPTION FILTER
Sr24 SECOND RECEPTION FILTER
Sr34 THIRD RECEPTION FILTER
Sr44 FOURTH RECEPTION FILTER

The invention claimed is:

1. A high frequency module for wireless communication, the high frequency module comprising:
a first band processing circuit comprising a first transmission filter configured to filter a signal of a first frequency band and to output a first transmission signal, the first transmission signal being the signal of the first frequency band as filtered by the first transmission filter;
a second band processing circuit comprising a second transmission filter configured to filter a signal of a second frequency band and to output a second transmission signal, or comprising a second reception filter configured to filter a second signal of the second frequency band and to output a second reception signal, the second transmission signal being the signal of the second frequency band as filtered by the second transmission filter and the second reception signal being the second signal of the second frequency band as filtered by the second reception filter, and the first frequency band being different than the second frequency band; and
a third band processing circuit comprising a third reception filter configured to filter a signal of a third frequency band and to output a third reception signal, the third reception signal being the signal of the third frequency band as filtered by the third reception filter, and the third frequency band being different than the first and second frequency bands, wherein:
the first band processing circuit, the second band processing circuit, and the third band processing circuit are provided on a main substrate,
the first band processing circuit operates at the same time as the third band processing circuit, and the second band processing circuit does not operate at the same time as the first band processing circuit and the third band processing circuit, when wireless communication is performed by the high frequency module,
a frequency band of the third reception signal includes a harmonic frequency of the first transmission signal, and
when viewed in a plan view, the second band processing circuit is disposed between the first band processing circuit and the third band processing circuit on the main substrate.

2. The high frequency module according to claim 1, wherein:
the first band processing circuit further comprises a first reception filter configured to filter a second signal of the first frequency band and to output a first reception signal, the first reception signal being the second signal of the first frequency band as filtered by the first reception filter, and
the third band processing circuit further comprises a third transmission filter configured to filter a second signal of the third frequency band and to output a third transmission signal, the third transmission signal being the second signal of the third frequency band as filtered by the third transmission filter.

3. The high frequency module according to claim 2, wherein:
the first transmission filter and the first reception filter constitute a first duplexer of the first band processing circuit,
the second transmission filter and the second reception filter constitute a second duplexer of the second band processing circuit, and
the third transmission filter and the third reception filter constitute a third duplexer of the third band processing circuit.

4. The high frequency module according to claim 2, further comprising:
a fourth band processing circuit that is provided on the main substrate and that comprises a fourth transmission filter configured to filter a signal of a fourth frequency band and to output a fourth transmission signal, or that comprises a fourth reception filter configured to filter a second signal of the fourth frequency band and to output a fourth reception signal, the fourth transmission signal being the signal of the fourth frequency band as filtered by the fourth transmission filter and the fourth reception signal being the second signal of the fourth frequency band as filtered by the fourth reception filter, wherein:

frequency bands of the first, second, and third reception signals do not include frequencies of a fundamental wave and a harmonic of the fourth transmission signal, a frequency band of the fourth reception signal does not include frequencies of a fundamental wave and a harmonic of each of the first, second and third transmission signals, and when viewed in the plan view, the fourth band processing circuit is disposed between the first band processing circuit and the third band processing circuit on the substrate.

5. The high frequency module according to claim 1, further comprising:

a fourth band processing circuit that is provided on the main substrate and that comprises a fourth transmission filter configured to filter a signal of a fourth frequency band and to output a fourth transmission signal, or that comprises a fourth reception filter configured to filter a second signal of the fourth frequency band and to output a fourth reception signal, the fourth transmission signal being the signal of the fourth frequency band as filtered by the fourth transmission filter and the fourth reception signal being the second signal of the fourth frequency band as filtered by the fourth reception filter, and the second frequency band being different than the first, second, and third frequency bands, wherein the fourth band processing circuit does not operate at the same time as the first band processing circuit and the third band processing circuit when wireless communication is performed by the high frequency module, and wherein, when viewed in the plan view, the fourth band processing circuit is disposed between the first band processing circuit and the third band processing circuit on the main substrate.

6. The high frequency module according to claim 5, further comprising:

a first amplification circuit configured to output the signal of the first frequency band to the first band processing circuit and to output the signal of the second frequency band to the second band processing circuit; and a second amplification circuit configured to output the signal of the third frequency band to the third band processing circuit and to output the signal of the fourth frequency band to the fourth band processing circuit, wherein:

a first substrate and a second substrate are provided on the main substrate, the second substrate being located adjacent to the first substrate, the first band processing circuit, the second band processing circuit, and the first amplification circuit are formed on the first substrate, and the third band processing circuit, the fourth band processing circuit, and the second amplification circuit are formed on the second substrate.

7. The high frequency module according to claim 6, wherein the first amplification circuit is configured to gen-
erate a harmonic included in the frequency band of the third reception signal, and the first amplification circuit is located farther from the third band processing circuit than the second band processing circuit.

8. The high frequency module according to claim 1, wherein the harmonic of the first transmission signal is a third order harmonic.

9. A communication device comprising:

a signal processing circuit configured to process a high frequency signal; and a front-end circuit formed by the high frequency module according to claim 1.

10. A high frequency module for wireless communication, the high frequency module comprising:

a first band processing circuit comprising a first transmission filter configured to filter a signal of a first frequency band and to output a first transmission signal, the first transmission signal being the signal of the first frequency band as filtered by the first transmission filter;

a second band processing circuit comprising a second transmission filter configured to filter a signal of a second frequency band and to output a second transmission signal, or comprising a second reception filter configured to filter a second signal of the second frequency band and to output a second reception signal, the second transmission signal being the signal of the second frequency band as filtered by the second transmission filter and the second reception signal being the second signal of the second frequency band as filtered by the second reception filter, and the first frequency band being different than the second frequency band; and a third band processing circuit comprising a third reception filter configured to filter a signal of a third frequency band and to output a third reception signal, the third reception signal being the signal of the third frequency band as filtered by the third reception filter, and the third frequency band being different than the first and second frequency bands, wherein:

the first band processing circuit, the second band processing circuit, and the third band processing circuit are provided on a main substrate, the first band processing circuit operates at the same time as the third band processing circuit when wireless communication is performed by the high frequency module, a frequency band of the third reception signal includes a harmonic frequency of the first transmission signal, a frequency band of the third reception signal does not include frequencies of a fundamental wave and a harmonic of the second transmission signal, and when viewed in a plan view, the second band processing circuit is disposed between the first band processing circuit and the third band processing circuit on the main substrate.

11. The high frequency module according to claim 10, wherein:

the first band processing circuit further comprises a first reception filter configured to filter a second signal of the first frequency band and to output a first reception signal, the first reception signal being the second signal of the first frequency band as filtered by the first reception filter, and the third band processing circuit further comprises a third transmission filter configured to filter a second signal of the third frequency band and to output a third transmission signal, the third transmission signal being the second signal of the third frequency band as filtered by the third transmission filter.

12. The high frequency module according to claim 11, wherein:
   the first transmission filter and the first reception filter constitute a first duplexer of the first band processing circuit,
   the second transmission filter and the second reception filter constitute a second duplexer of the second band processing circuit, and
   the third transmission filter and the third reception filter constitute a third duplexer of the third band processing circuit.

13. The high frequency module according to claim 10, wherein, when wireless communication is performed by the high frequency module and the second band processing circuit operates at the same time as the first band processing circuit, a frequency band of the first reception signal does not include frequencies of the fundamental wave and the harmonic of the second transmission signal, and a frequency band of the second reception signal does not include frequencies of a fundamental wave and the harmonic of the first transmission signal, and
   wherein, when wireless communication is performed by the high frequency module and the second band processing circuit operates at the same time as the third band processing circuit, the frequency band of the second reception signal does not include frequencies of a fundamental wave and a harmonic of the third transmission signal.

14. The high frequency module according to claim 10, further comprising:
   a fourth band processing circuit that is provided on a fourth band processing circuit that is provided on the main substrate and that comprises a fourth transmission filter configured to filter a signal of a fourth frequency band and to output a fourth transmission signal, or that comprises a fourth reception filter configured to filter a second signal of the fourth frequency band and to output a fourth reception signal, the fourth transmission signal being the signal of the fourth frequency band as filtered by the fourth transmission filter and the fourth reception signal being the second signal of the fourth frequency band as filtered by the fourth reception filter, wherein:
   the frequency bands of the first, second, and third reception signals do not include frequencies of a fundamental wave and a harmonic of the fourth transmission signal,
   a frequency band of the fourth reception signal does not include the frequencies of the fundamental wave and the harmonic of each of the first, second, and third transmission signals, and
   when viewed in the plan view, the fourth band processing circuit is disposed between the first band processing circuit and the third band processing circuit on the main substrate.

15. The high frequency module according to claim 14, further comprising:
   a first amplification circuit configured to output the signal of the first frequency band to the first band processing circuit and to output the signal of the second frequency band to the second band processing circuit; and
   a second amplification circuit configured to output a second amplification circuit configured to output the signal of the third frequency band to the third band processing circuit and to output the signal of the fourth frequency band to the fourth band processing circuit, wherein:
   a first substrate and a second substrate are provided on the main substrate, the second substrate being located adjacent to the first substrate,
   the first band processing circuit, the second band processing circuit, and the first amplification circuit are formed on the first substrate, and
   the third band processing circuit, the fourth band processing circuit, and the second amplification circuit are formed on the second substrate.

16. The high frequency module according to claim 15, wherein the first amplification circuit is configured to generate a harmonic included in the frequency band of the third reception signal, and the first amplification circuit is located farther from the third band processing circuit than the second band processing circuit.

17. The high frequency module according to claim 10, further comprising:
   a fourth band processing circuit that is provided on the main substrate and that comprises a fourth transmission filter configured to filter a signal of a fourth frequency band and to output a fourth transmission signal, or that comprises a fourth reception filter configured to filter a second signal of the fourth frequency band and to output a fourth reception signal, the fourth transmission signal being the signal of the fourth frequency band as filtered by the fourth transmission filter and the fourth reception signal being the second signal of the fourth frequency band as filtered by the fourth reception filter, and the second frequency band being different than the first, second, and third frequency bands,
   wherein the fourth band processing circuit does not operate at the same time as the first band processing circuit and the third band processing circuit when wireless communication is performed by the high frequency module, and
   wherein, when viewed in the plan view, the fourth band processing circuit is disposed between the first band processing circuit and the third band processing circuit on the main substrate.

18. The high frequency module according to claim 10, wherein the harmonic of the first transmission signal is a third order harmonic.

19. A communication device comprising:
   a signal processing circuit configured to process a high frequency signal; and
   a front-end circuit formed by the high frequency module according to claim 10.

20. A high frequency module comprising:
   a substrate;
   a first band processing circuit that is provided on the substrate and that comprises a first transmission filter configured to filter a signal of a first frequency band and to output a first transmission signal, the first transmission signal being the signal of the first frequency band as filtered by the first transmission filter;
   a second band processing circuit that is provided on the substrate and that comprises a second transmission filter configured to filter a signal of a second frequency band and to output a second transmission signal, or that comprises a second reception filter configured to filter a second signal of the second frequency band and to output a second reception signal, the second transmission signal being the signal of the second frequency band as filtered by the second transmission filter and the second reception signal being the second signal of the second frequency band as filtered by the second reception filter, and the first frequency band being different than the second frequency band; and a third band processing circuit that is provided on the substrate and that comprises a third reception filter configured to filter a signal of a third frequency band and to output a third reception signal, the third reception signal being the signal of the third frequency band as filtered by the third reception filter, and the third frequency band being different than the first and second frequency bands, wherein:

a frequency band of the third reception signal includes a harmonic frequency of the first transmission signal, and when viewed in a plan view, the second band processing circuit is disposed between the first band processing circuit and the third band processing circuit on the substrate.

\* \* \* \* \*